United States Patent [19]

Marciniec

[11] 4,206,541
[45] Jun. 10, 1980

[54] METHOD OF MANUFACTURING THIN FILM THERMAL PRINT HEADS

[75] Inventor: Edmund T. Marciniec, Chicago, Ill.

[73] Assignee: Extel Corporation, Northbrook, Ill.

[21] Appl. No.: 918,845

[22] Filed: Jun. 26, 1978

[51] Int. Cl.² .............................................. H05B 3/16
[52] U.S. Cl. ........................................ 29/611; 29/620;
 101/1; 156/656; 156/657; 156/663; 204/15;
 219/216; 346/76 PH
[58] Field of Search .............. 204/192 E, 192 R, 32 S,
 204/32 R, 15; 346/76 PH; 101/1; 219/216;
 156/656, 657, 663; 29/611, 620

[56] References Cited

U.S. PATENT DOCUMENTS

| | | | |
|---|---|---|---|
| 3,808,108 | 4/1974 | Herb et al. | 204/192 E |
| 3,852,563 | 12/1974 | Bohorquez | 219/216 |
| 3,953,264 | 4/1976 | Wu | 219/216 |
| 3,971,684 | 7/1976 | Muto | 204/192 E |
| 3,973,106 | 8/1976 | Ura | 219/216 |
| 4,007,352 | 2/1976 | Ura | 29/611 |
| 4,030,408 | 6/1977 | Miwa | 219/216 |
| 4,038,517 | 7/1977 | Nelson | 219/216 |
| 4,059,480 | 11/1977 | Ruh | 156/663 |

FOREIGN PATENT DOCUMENTS

2537142  5/1976  Fed. Rep. of Germany ........... 219/216

*Primary Examiner*—Jerome W. Massie
*Attorney, Agent, or Firm*—Kinzer, Plyer, Dorn & McEachran

[57] ABSTRACT

A dielectric substrate for a thin film dot matrix thermal print head has its working surface etched or otherwise treated to selectively remove the dielectric material, in all areas which will constitute electrical connectors for the resistance heater print elements, to a depth at least equal to the sum of the thicknesses of all of the conductive films to be applied to the substrate surface in those areas, following which the working surface of the substrate is selectively coated with films of high-resistance electrically conductive material and low-resistance conductive material, with suitable adhesion films as required, to complete the print head. An outer protective wear-resistant film is also employed. The resultant print head has its resistance heater print elements and blank surface elements raised at least to the same level as the outer surfaces of the electrical connectors, and preferably slightly higher, to provide improved performance and operating life.

10 Claims, 6 Drawing Figures

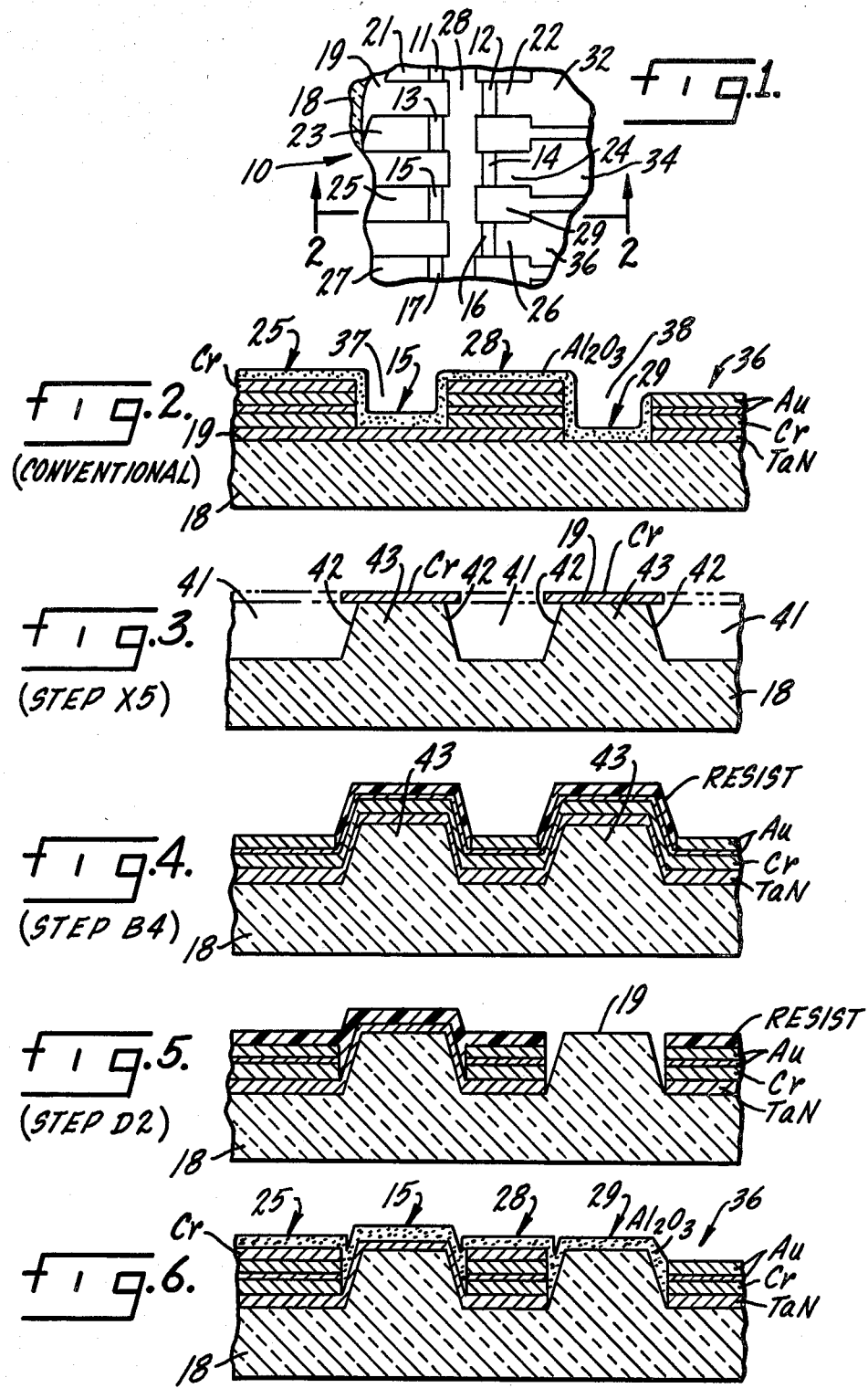

METHOD OF MANUFACTURING THIN FILM THERMAL PRINT HEADS

Technical Field

The technical field of the invention is the manufacture of teleprinter print heads for use with thermal recording paper.

BACKGROUND ART

In a dot matrix printer, each character is printed as a pattern of individual elements—dots, bars, and other shapes may be used. The most common type of dot matrix print head utilizes a series of rods as print elements. The print rods are driven selectively into impacting relation with the recording medium, which may be an impact-sensitive paper or the combination of ordinary paper and an inked ribbon. Another dot matrix print head uses tiny individual resistance heaters as the print elements, in combination with a thermally-responsive recording paper.

A variety of different constructions have been proposed for dot matrix thermal print heads. Perhaps the most efficient and effective basic construction employs a plurality of very thin conductive films superimposed upon a dielectric substrate. One of the films is of a high-resistance material; tiny individual areas of that film constitute the resistance heater elements used to form the printed characters. Low-resistance high-conductivity metal films afford selective electrical circuit connections to the resistance heater print elements. Quite frequently, an outer wear protection film is used to prevent undue wear on the print head surface, which must be maintained in pressure contact with the recording paper during the printing operation. The wear protection film is preferably non-conductive.

In these thin film dot matrix thermal print heads, it is also known to provide additional films for obtaining effective adhesion between the basic operational films, particularly between the conductive film used for electrical connections and the films employed for the resistance heater elements and for wear protection. It is almost always necessary to have the conductive films superimposed upon each other in order to afford effective electrical connections between the films; the films are too thin to provide effective electrical connections in abutting relationship.

Although the films employed in the fabrication of a dot matrix thermal print head of the kind described are extremely thin, with their thicknesses being measured in Angstroms, the usual construction of a thin film thermal print head nevertheless leaves definite depressions and pockets between the electrical connectors, which are usually the thickest part of the composite film structure. Furthermore, the high-resistance film is usually located, for practical reasons, at the bottom of the superimposed film layers. This results in several distinct disadvantages which impose substantial limitations on the operating life of the print head. In particular, the electrical connector films, at the outer surface of the print head, may be subject to excessive abrasion from the necessary pressure contact with the recording paper. This can definitely shorten the life of the print head.

Another distinct problem results from the collection of carbonized thermally reactive chemicals, present in the recording paper, and burnt paper lint in the depressions and pockets between the conductors. This accumulation ultimately reaches a level that tends to separate the print head from the paper, causing a decrease in print quality. Furthermore, the accumulated deposits have many characteristics similar to ink and tend to smear the recording paper. This problem is accentuated in those constructions in which the resistive elements are located immediately upon the surface of the print head base, with a pocket for accumulation of carbonized chemicals and burnt paper lint immediately over each print element. There, accumulation creates a thermal barrier between the resistance heater print element and the paper leading to marked deterioration in print quality.

DISCLOSURE OF INVENTION

It is a principal object of the present invention, therefore, to provide a new and improved method of manufacture of a thin film dot matrix thermal print head that effectively eliminates pockets and depressions in the print head surface and thus precludes the build-up of deposits between the electrical connectors of the print head. In particular, any deposits over the resistance heater print elements are completely eliminated.

A specific object of the invention is to provide a new and improved method of manufacture of a thin film dot matrix thermal print head that increases the efficiency of heat transfer from the resistance heater print elements to the recording paper by locating the print elements at the extreme outer surface of the print head; this construction has the further advantage of decreasing the pressure necessary for quality printing.

Another object of the invention is to provide a new and improved thin film dot matrix thermal print head construction affording improved printing qualities which substantially extended operating life, yet requiring minimal additional cost as compared with more conventional print head constructions.

Accordingly, the invention relates to a method of manufacture of a thin-film dot matrix thermal print head that comprises a dielectric substrate having one surface including a pattern of resistance heater print elements, electrical connectors, and intervening blank spaces, which method includes the step of:

A. selectively forming a high-resistance electrically conductive film on those areas of one surface of a dielectric substrate that are to constitute the print elements and electrical connectors of the print head, leaving blank areas that constitute neither print elements nor electrical connectors; and B. selectively forming one or more additional films, including at least one low-resistance electrically conductive film, on those areas of the surface of the high-resistance film that are to constitute the electrical connectors. The improvement of the invention comprises the additional step of selectively removing material from the one surface of the dielectric substrate, prior to step A, in and only those areas that are to constitute electrical connectors in the completed print head, to a depth at least equal to the sum of the thicknesses of all of the films to be applied to the one substrate surface in step B. There is no corresponding removal of substrate material from the print element areas or from the blank areas, so that the print elements are formed on the extreme outer surface of the substrate at an elevation at least as great as the outermost surfaces of the electrical connectors and the blank areas retain an elevation at least as great as the outermost surfaces of the electrical connectors. Thus, the electrical connectors are protected against external contact, in use, by both the print elements and the blank areas of the print head, and accumulation of deposits of material between the electrical connectors are precluded.

BRIEF DESCRIPTION OF THE DRAWINGS

FIG. 1 is a fragmentary detail plan view, on an enlarged scale, of a portion of a dot matrix thermal print head;

FIG. 2 is a detail cross-sectional view, on a further much enlarged scale, of a thermal print head manufactured by a generally conventional method, taken approximately along line 2—2 in FIG. 1; and FIGS. 3, 4, 5 and 6 are cross-sectional views of the same portion of a print head as shown in FIG. 2 at successive stages in the manufacturing method of the present invention, FIG. 6 showing the completed print head construction.

BEST MODE FOR CARRYING OUT THE INVENTION

A thermal print head for a dot matrix printer comprises a plurality of dot-size individual print elements, arranged in one or more columns, each print element being a resistance heater. The fragmentary portion 10 of a print head that is illustrated in FIG. 1 includes an array of resistance heater print elements 11 through 17 arranged in two columns. As illustrated, the print elements of the two columns are staggered with respect to each other so that by successive printing operations a continuous vertical line can be imprinted. Other print element patterns using one, two, or more columns of print elements, staggered or aligned in transverse rows, can all be produced using the present invention.

The print elements 11–17 are supported upon one surface 19 of an insulator base or substrate 18. Base 18 may be formed of any desired dielectric material; preferably, substrate 18 is formed of a silica dielectric, either crystalline (quartz) or vitreous (glass).

On the surface 19 of the print head substrate 18 there are also a plurality of electrical connectors 21 through 27, one for each of the resistance heater print elements 11–17. A common electrical connector 28 extends to all of the print elements 11–17. Thus, by selective completion of electrical circuits to the connectors 21–27, controlled energization of the print elements can be effected to reproduce various characters. Connectors 21–27 each terminate in an enlarged contact pad; three of the contact pads 32, 34 and 36 are shown in FIG. 1. It will be recognized that FIG. 1 is schematic in nature; the actual geometry of print head 10 is subject to substantial variation.

One conventional method of fabrication for a thermal print head of the type generally illustrated in FIG. 1 starts with the deposition of a film of high-resistance electrically conductive material on that surface 19 of substrate 18 that is to constitute the working surface of the print head. Tantalum nitride can be employed for this high resistance film; other high-resistance conductive materials can also be used. In a given construction, such as that shown in FIG. 2, an adhesion film of chromium may be applied over the high-resistance tantalum nitride film, followed by a thin film of a low-resistance conductive material, preferably gold. These three films (TaN, Cr, Au) cover all of surfaces 19 at this stage of the process.

The next step, in the generally conventional process used to produce the print head construction shown in cross section in FIG. 2, is a photoshaping procedure in which a photoresist is applied to the thin gold film. That resist is selectively exposed and then developed, removing the exposed portions of the resist. The resist is then used as a mask for etching or for further deposition of gold in order to delineate the electrical connector elements 21–27 of the print head and their contact pads 32, 34 and 36. Subsequently, a second adhesion film of chromium is deposited on top of the gold connectors. Finally, a dielectric wear protection film of aluminum oxide or some other hard wear-resistant material (e.g., silicon nitride) is deposited over the entire surface of the head, except for the contact pads at the ends of the electrical connectors, which are left exposed for connection to external control circuits. This results in a construction like that shown in FIG. 2, in which the connector 25, the resistance heater print element 15, the common (ground) connector 28, a blank space 29 between connectors, and a portion of the connector contact pad 36 are shown.

A dot matrix thermal print head having the construction illustrated in FIG. 2 has several disadvantages, as noted above. The resistance heater print element 15 is located below the surface of the connectors 25 and 28, so that the electrical connectors are subject to excessive abrasion from contact with the recording paper. There is a substantial tendency for collection of carbonized thermally reactive chemicals and burnt paper lint in the depressions 37 and 38 between the connectors. This accumulation has an adverse effect on print quality, causing smearing of the paper recording surface. Further, the accumulation of material in one of the spaces over a print element, such as space 37 over print element 15, creates a thermal barrier between the print element and the paper, reducing the efficiency of print head operation.

To effectively minimize and, indeed, essentially eliminate these difficulties, the process of the present invention has been developed to produce a thermal print head in which the electrical connectors are located in recesses in the surface of the dielectric substrate and the resistance heater print elements are raised at least to the level of the outer surface of the electrical connectors. In one embodiment, some of the basic steps for fabrication of the print head remain essentially the same as described above:

A. A high-resistance electrically conductive film, such as tantalum nitride, is applied to the surface of a dielectric substrate that is to constitute the working surface of a print head; typically, the resistance film is best applied by a sputtering process.

B. A low-resistance electrically conductive film (e.g., gold) is applied to the surface of the previously deposited high-resistance film; again, sputtering can be employed. If desired, an adhesion layer may be interposed between the two conductive films; chromium is suitable. Additional low-resistance electrically conductive material may now be deposited in the electrical connector areas; gold is again suitable.

C. The low-resistance film is selectively removed, by etching or comparable techniques, from all areas that are to constitute resistance heater print elements and also from all areas that are to comprise blank spaces in the completed print head, leaving a pattern of low-resistance electrical connectors.

D. The high-resistance film is selectively removed, as by etching, from all areas that are to constitute blank spaces in the completed print head. Subsequently, a protective wear coating can be applied to the entire print head surface, except for contact pads at the ends of the electrical connectors. It can be seen that these basic steps constitute the essentials of the conventional manufacturing procedure described above. In the method of the present invention, however, there is an additional step that must be performed at the beginning, before the high-resistance conductive film is applied to the substrate, as follows:

X. A portion of the print head surface of the dielectric substrate is selectively removed from all areas that are to constitute electrical connectors in the completed print head, preferably to a depth at least equal to the sum of the thicknesses of all of the films that will subsequently be applied to the substrate surface in step B.

This process results in a print head construction that appears, in cross section, as shown in FIG. 6. In comparison with the conventional construction of FIG. 2, the print head construction of FIG. 6 has a number of advantages. There are no spaces for build-up of charred paper lint and other such materials between the electrical connectors of the print head. There are no pockets for accumulation of such materials over the print elements, so that the heat transfer efficiency of the print head remains unimpaired over long periods of use. Consequently, the amount of print head pressure required for clear printing is reduced, with improved print quality and increased life for the print head.

The improvement embodied in step X is not dependent upon retention of all of the procedures of steps A through D as set forth above. For example, though the presently preferred practice is to deposit the high-resistance film onto the entire print head surface of the substrate and later selectively etch away the intervening blank spaces, this procedure can be altered by masking the print head surface to avoid deposition in the blank spaces. A similar technique can be used for depositing the film or films constituting the electrical connectors. Thus, reduced to essentials, the film-deposition steps are seen to be:

A. selectively forming a high-resistance electrically conductive film on those areas of one surface of a dielectric substrate that are to constitute the print elements and electrical connectors of the print head; and B. selectively forming one or more additional films, including at least one low-resistance electrically conductive film, on those areas of the surface of the high-resistance film that are to constitute the electrical connectors.

Step X remains unchanged.

A complete detailed manufacturing procedure, utilizing the method of the present invention in the fabrication of the construction shown in FIG. 6, may be described as follows:

Step X

The preliminary major step that is characteristic of the present invention is first performed, consisting of the following sub-steps X1 through X6.

X1. A dielectric substrate, and particularly the substrate surface that is to be the working print head surface, is thoroughly cleaned, preferably in a boiling solution of ammonium hydroxide, hydrogen peroxide and water. This cleaning procedure is typical as applied to a quartz or glass substrate; a different cleaning procedure may be necessary for other dielectric substrate materials.

X2. A film of chromium is applied to the entire print head surface of the dielectric substrate, as by sputter deposition.

X3. A layer of photoresist material is applied across the entire print head surface. The resist is pre-baked and is then exposed through a photomask that masks all areas of the surface except those that are to constitute the electrical connectors, including their contact pads, in the completed print head. After exposure, the photoresist layer is selectively removed, by dissolving the exposed portions of the resist, leaving a resist pattern on the chromium film covering all of the electrical connector areas of the print head. Post-baking may be employed at this juncture.

X4. The chromium film on the substrate is now etched away, removing the chromium from all areas not covered by the photoresist. That is, a mask of chromium is left on the surface of the dielectric substrate covering all of the areas that are not to constitute electrical connectors and contact pads in the completed print head. This etch can be accomplished chemically with a solution of ammonium nitrate, nitric acid and water. Following the etching of the chromium, the photoresist is stripped away.

X5. At this point, the dielectric substrate itself is etched, using an etching technique that will attack the dielectric but not the remaining pattern of chromium. For chemical etching of a glass or quartz substrate, the etchant used may be a solution of ammonium fluoride and hydrofluoric acid. By adjusting the ratio of chemicals used for the etchant, the slope of the etched walls in the substrate can be controlled. The resulting construction is shown in FIG. 3. The etched-away portions 41 of the silica substrate 18 each have a positive slope, along their walls 42, leading up to the unetched chromium covered substrate surface portions 43. That is, undercutting of the unetched portions 43 is desired. A definite positive slope, as shown, is highly desirable to insure good stop coverage.

X6. The chromium film on top of the unetched portions 43 of the substrate 18 (FIG. 3) is now removed. This may be accomplished by dissolution in a solution of ammonium nitrate, nitric acid, and water.

Step A

A high-resistance electrically conductive film, such as tantalum nitride, is now applied to the entire etched print head surface of the dielectric substrate 18. A sputtering process may be used to deposit this resistor film. The film covers both the etched and the unetched surface areas of the dielectric substrate. Prior to deposition of the high-resistance conductive film, it is usually desirable to employ a further cleaning step, which may be accomplished with a boiling solution of ammonium hydroxide, hydrogen peroxide, and water.

Step B

A thin film of low-resistance electrically conductive material, such as gold, is now applied to the surface of the previously deposited high-resistance tantalum nitride film. This major step may consist of the following sub-steps B1 through B4:

B1. Initially, to assure good adhesion, a thin film of chromium is applied to the previously deposited tantalum nitride film. A sputter deposit technique is preferably utilized.

B2. A thin film of low-resistance electrically conductive material, such as gold, is formed on the surface of the chromium film; again, sputtering can be used. The chromium and gold films both extend throughout the surface area of the print head, covering the tantalum nitride layer.

B3. A layer of photoresist material is next applied to the print head surface. The resist is pre-baked and then exposed through the same photomask as used in step X3. Following sequence, the resist layer is developed, again as in step X3, and then post-baked, leaving a resist pattern covering all of the substrate surface area except those portions which are to comprise electrical connectors, including their contact pads.

B4. With the photoresist sill in place, an additional and thicker layer of high conductivity material, preferably gold, is electroplated onto the portions of the print head surface which are not protected by a resist layer. This results in the intermediate construction shown in FIG. 4.

Step C

The low-resistance electrically conductive film and the chromium adhesion film are now selectively removed from all of the areas that are to constitute resistance heater print elements and also from all areas that are to comprise blank spaces in the completed print head. This major step comprises the following sub-steps:

C1. The remaining resist material (see FIG. 4) is stripped away.

C2. The thin, original gold film covering the elevated portions 43 of the substrate (FIG. 4) is selectively eliminated. This can be effected by a chemical etchant comprising a solution of potassium iodide, iodine, and water. Of course, some of the thicker electroplated gold layer in the connector areas will also be removed, but the process can readily be controlled to leave substantial gold in the connector areas without requiring an additional photoresist procedure.

C3. The exposed chromium adhesion film covering the unetched elevated portions 43 of the substrate is now removed. This is most conveniently accomplished by a chemical etchant, such as a solution of ammonium nitrate, nitric acid and water, that does not attack gold. At this point it is a good idea to bake the print head to remove any water accumulation.

Step D

The high-resistance TaN film must now be removed from all areas that are to constitute blank spaces in the completed print head. This procedure may comprise sub-steps D1 and D2 as follows:

D1. A fresh layer of photoresist is applied to the print head surface, as in sub-step X3; the resist is pre-baked and is then exposed through a photomask which masks only the areas that are to constitute print elements or electrical connectors (not blank spaces). The photoresist is then developed, removing the resist from the blank spaces, followed by post-baking as in sub-step X3.

D2. The high-resistance film (TaN) is now etched away in the blank space areas, which are not protected by the resist, resulting in the intermediate construction shown in FIG. 5. A conventional chemical etch procedure can be employed. Preferably, however, this etching step is effected by the procedure known as "sputter etching."

Finishing Steps E

From this point the finishing steps for the print head, to complete the construction shown in FIG. 6, may be as follows:

E1. The remaining photoresist (see FIG. 5) is stripped away from the electrical connector and print element areas, followed by a further cleaning, preferably in a boiling solution of ammonium hydroxide, hydrogen peroxide and water, and a bake-out to eliminate water vapor.

E2. A further layer of photoresist is applied, pre-baked, exposed, developed, and post-baked, all as in step X3 and using the same photomask, resulting in a resist covering on all areas except the electrical connectors and their contact pads.

E3. An adhesion film, preferably chromium, is applied to the electrical connectors by sputter deposition, with the enlarged contact pads mechanically masked to preclude deposits on their surfaces.

E4. The photoresist is again stripped from the print head, followed by cleaning and bake out as in step E1.

E5. A wear protection layer is applied to all areas of the print head surface except the contact pads. Using aluminum oxide as the wear surface layer, this substep can best be carried out by sputter deposition with the contact pads mechanically masked. The resulting print head has the cross-sectional construction shown in FIG. 6.

It will be recognized that the relative proportions of the print head elements, particularly the thicknesses of the various films, cannot be accurately depicted in the drawings. Accordingly, a specific example of individual film thicknesses, as employed in a thermal print head that has been tested through a life entailing imprinting of more than $10^7$ characters, is provided herewith:

Resistance Film (TaN): 1000 Angstroms
First Adhesion Film (Cr): 3000 Angstroms
First Conductive Film (Au): 1000 Angstroms
Second Conductive Film (Au): 18,000 Angstroms
Second Adhesion Film (Cr): 3000 Angstroms
Wear Protection Film ($Al_2O_3$): 2500 Angstroms It will also be recognized that the particular materials selected for use in the individual films of the thermal print head can be varied to a substantial extent. For example, although tantalum nitride is identified above as a preferred material for the high-resistance film of the print head, a variety of other resistive materials are quite usable. These include molybdenum, metallic tantalum, alloys of tantalum and aluminum, and many other resistive film materials. For the high-conductivity films that form the electrical connectors, gold is almost universally employed, but silver and copper can also be used if desired. The outer wear protection film may also be formed of a wide variety of materials; in addition to the aluminum oxide of the specific example given above, tantalum oxide, tungsten oxide, silicon nitride, silica (glass) and others are readily adaptable to the print head construction. It will also be noted that in the foregoing description use of a positive photoresist is assumed, but photoresists of the negative type can also be employed.

I claim:

1. In the method of manufacture of a thin-film dot matrix thermal print head that comprises a dielectric substrate having one surface including a pattern of resistance heater print elements, electrical connectors, and intervening blank spaces, which method includes the steps of:

A. selectively forming a high-resistance electrically conductive film on those areas of one surface of a dielectric substrate that are to constitute the print elements and electrical connectors of the print head, leaving blank spaces that constitute neither print elements nor electrical connectors; and B. selectively forming one or more additional films, including at least one low-resistance electrically conductive film, on those areas of the surface of the high-resistance film that are to constitute the electrical connectors;

the improvement comprising the following additional step:

X. selectively removing substrate material from the one surface of the dielectric substrate, prior to step A, in all and only those areas that are to constitute electrical connectors in the completed print head, to a depth at least equal to the sum of the thicknesses of all of the films to be applied to the one substrate surface in step B, without a corresponding removal of substrate material from the areas that are to constitute print elements or from the blank spaces, so that the print elements are formed on the extreme outer surface areas of the substrate at an elevation at least as great as the outermost surfaces of the electrical and the blank areas retain an elevation at least as great as the outermost surfaces of the electrical connectors, whereby the electrical connectors are protected against external contact, in use, by both the print elements and the blank spaces of the print head and accumulation of deposits of material between the electrical connectors is precluded.

2. In the method of manufacture of a thin-film dot matrix thermal print head that comprises a dielectric substrate having one surface including a pattern of resistance heater print elements, electrical connectors, and intervening blank spaces, which method includes the steps of:

A. applying a high-resistance electrically conductive film to one surface of a dielectric substrate;

B. applying one or more additional films, including at least one low-resistance electrically conductive film, to the surface of the high-resistance film;

C. selectively eliminating the films applied in step B from all areas that are to constitute print elements and blank spaces in the completed print head, leaving a pattern of low-resistance electrical connectors for the print elements;

D. and selectively removing the high-resistance film from all areas that are to constitute blank spaces in the completed print head;

the improvement comprising the following additional step:

X. selectively removing substrate material from the one surface of the dielectric substrate, prior to step A, in all and only those areas that are to constitute electrical connectors in the completed print head, to a depth at least equal to the sum of the thicknesses of all of the films to be applied to the one substrate surface in step B, without a corresponding removal of substrate material from the areas that are to constitute print elements or from the blank spaces, so that the print elements are formed on the extreme outer surface areas of the substrate an an elevation at least as great as the outermost surfaces of the electrical connectors and the blank areas retain an elevation at least as great as the outermost surfaces of the electrical connectors, whereby the electrical connectors are protected against external contact, in use, by both the print elements and the blank spaces of the print head and accumulation of deposits of material between the electrical connectors is precluded.

3. The improved method of manufacture of a thin-film thermal print head, according to either claim 1 or claim 2, in which step X is effected by chemical etching of the surface of the substrate.

4. The improved method of manufacture of a thin-film thermal print head, according to claim 3, in which the positive transition slope from any unetched surface area of the substrate to any adjacent etched surface area, so that the print elements are electrically connected to the electrical connectors by portions of the high resistance film deposited on such positive transition slopes.

5. The improved method of manufacture of a thin-film thermal print head, according to claim 4, in which the substrate is a vitreous or crystalline silica material and in which the chemical etching effected in step X employs a solution of ammonium fluoride and hydrofluoric acid as the etchant.

6. The improved method of manufacture of a thin-film thermal print head, according to either claim 1 or claim 2, in which step X is carried out by a process which leaves a positive transition slope from any unaffected surface area of the substrate to any adjacent depressed surface area, so that the print elements are electrically connected to the electrical connectors by portions of the high resistance film deposited on such positive transition slopes.

7. The improved method of manufacture of a thin-film thermal print head, according to claim 2, in which step B comprises the following sequence of sub-steps:

B1. applying an adhesion film to the surface of the high-resistance film;

B2. applying an initial thin, low-resistance electrically conductive film to the surface of the adhesion film;

B3. masking all of the surface area of the low-resistance conductive film except the areas required for electrical connectors; and B4. depositing a much thicker low-resistance electrically conductive film on the exposed electrical connector areas of the initial low-resistance film;

and in which step C includes the elimination of the adhesion film as well as the low-resistance films from the print elements and blank spaces.

8. The method of manufacture of a thin-film dot matrix thermal print head that comprises a dielectric substrate having one surface including a pattern of resistance heater print elements, electrical connectors, and intervening blank spaces, which method includes the steps of:

applying a first etching mask to all areas of a selected print head surface on a silica substrate except those areas that are to constitute electrical connectors;

etching the unmasked areas of the print head surface to a depth at least equal to the sum of the thicknesses of all of the conductive films to be subsequently applied to the electrical connector areas, employing an etching procedure which leaves a positive transition slope from any unaffected surface area of the substrate to any adjacent depressed surface area;

removing the first etching mask;

sputter depositing high-resistance electrically conductive film onto the print head surface, including the transition slopes;

sputter depositing an adhesion film onto the high-resistance film;

sputter depositing a very thin low-resistance conductive film onto the adhesion film;

applying a second etching mask to all areas of the print head surface except those that are to constitute electrical connectors;

electroplating a substantially thicker low-resistance conductive film onto the unmasked electrical connector areas;

removing the second etching mask;

chemically etching away the thin low-resistance conductive film and the adhesion film from those areas not constituting electrical conductor areas;

applying a third etching mask to the print element and electrical connector areas of the print head;

etching the remaining unmasked blank space areas to remove the high-resistance film therefrom;

removing the third etching mask;

and applying a wear protection film to the entire print head surface, except for any contact areas required for external electrical circuit connections.

9. The improved method of manufacture of a thin film thermal print head, according to claim 8, in which the first etching mask is formed of a metal essentially inert to a chemical etchant that attacks the silica substrate, the adhesion film is chromium, the second and third etching masks are photoresist materials, and the low-resistance films are gold.

10. The improved method of manufacture of a thin-film thermal print head, according to claim 9, in which the high resistance conductive film is tantalum nitride and the etching of that film is effected by sputter etching.

* * * * *

UNITED STATES PATENT OFFICE
CERTIFICATE OF CORRECTION

PATENT NO. : 4,206,541

DATED : June 10, 1980

INVENTOR(S) : Edmund T. Marciniec

It is certified that error appears in the above-identified patent and that said Letters Patent are hereby corrected as shown below:

Column 2, line 57, after "in" insert -- all --.

Column 9, line 20, after "electrical" insert --connectors--.
Column 10, line 7, before "positive" insert --etching process employed in step X is one which leaves a--.

Signed and Sealed this

Eleventh Day of November 1980

[SEAL]

Attest:

SIDNEY A. DIAMOND

Attesting Officer

Commissioner of Patents and Trademark